United States Patent
Oh et al.

(10) Patent No.: US 10,986,740 B2
(45) Date of Patent: Apr. 20, 2021

(54) SOLID STATE DRIVE DEVICE AND DATA STORAGE SYSTEM INCLUDING THE SAME

(71) Applicant: Samsung Electronics Co., Ltd., Suwon-si (KR)

(72) Inventors: Teck-su Oh, Anyang-si (KR); Ji-won Park, Suwon-si (KR); Sung-chul Hur, Yongin-si (KR)

(73) Assignee: Samsung Electronics Co., Ltd.

(*) Notice: Subject to any disclaimer, the term of this patent is extended or adjusted under 35 U.S.C. 154(b) by 5 days.

(21) Appl. No.: 16/127,878

(22) Filed: Sep. 11, 2018

(65) Prior Publication Data

US 2019/0246508 A1  Aug. 8, 2019

(30) Foreign Application Priority Data

Feb. 6, 2018  (KR) .................. 10-2018-0014721

(51) Int. Cl.
*H05K 5/00* (2006.01)
*G06F 1/18* (2006.01)
*H05K 5/02* (2006.01)

(52) U.S. Cl.
CPC .......... *H05K 5/0026* (2013.01); *G06F 1/182* (2013.01); *G06F 1/187* (2013.01); *H05K 5/0004* (2013.01); *H05K 5/0217* (2013.01)

(58) Field of Classification Search
CPC .. H05K 5/0026; H05K 5/0004; H05K 5/0217; G06F 1/182; G06F 1/187; G06F 3/0679; G06F 3/0658; G06F 3/0626; G11C 5/00; G11B 33/0433; G11B 33/0411; G11B 33/1406; G11B 33/125
See application file for complete search history.

(56) References Cited

U.S. PATENT DOCUMENTS

| | | | | |
|---|---|---|---|---|
| 4,865,321 | A * | 9/1989 | Nakagawa | A63F 13/02 463/29 |
| 6,108,198 | A * | 8/2000 | Lin | G06F 1/181 312/223.1 |
| 6,201,692 | B1 * | 3/2001 | Gamble | G11B 33/126 312/223.3 |
| 6,735,080 | B1 * | 5/2004 | Chang | G11B 33/124 361/690 |
| 9,468,111 | B2 | 10/2016 | Yin et al. | |
| 9,504,175 | B2 | 11/2016 | Farquhar | |
| 9,684,345 | B2 | 6/2017 | Choi et al. | |
| 2002/0085358 | A1 * | 7/2002 | Homer | G11B 33/08 361/730 |

(Continued)

FOREIGN PATENT DOCUMENTS

KR  10-2014-0004864  1/2014

*Primary Examiner* — Hung S. Bui
*Assistant Examiner* — Sagar Shrestha
(74) *Attorney, Agent, or Firm* — Myers Bigel, P.A.

(57) ABSTRACT

A solid state drive device includes a housing defining an interior space and first through fourth edges defining a perimeter thereof; and a package substrate module in the interior space. The package substrate module includes a package base substrate, a plurality of semiconductor chips mounted on the package base substrate, and an external connector corresponding to the third edge of the housing. The housing includes at least one groove adjacent to the first edge and a rail unit on each of the second and fourth edges.

17 Claims, 10 Drawing Sheets

(56) References Cited

U.S. PATENT DOCUMENTS

| | | | |
|---|---|---|---|
| 2006/0012950 A1* | 1/2006 | Shih | G06F 1/184 361/679.33 |
| 2007/0025014 A1* | 2/2007 | Kim | G11B 33/08 360/97.19 |
| 2009/0103252 A1* | 4/2009 | Peng | G11B 33/124 361/679.4 |
| 2011/0069441 A1* | 3/2011 | Killen | G11B 33/124 361/679.33 |
| 2012/0134101 A1* | 5/2012 | Zhang | G06F 1/184 361/679.39 |
| 2012/0250279 A1* | 10/2012 | Harashima | G06F 1/187 361/760 |
| 2013/0140968 A1* | 6/2013 | Nagahori | H05K 5/0213 312/223.1 |
| 2013/0271920 A1* | 10/2013 | Chun | H01L 23/3672 361/705 |
| 2013/0327568 A1* | 12/2013 | Wang | H05K 5/0008 174/565 |
| 2014/0022740 A1* | 1/2014 | Tsai | G06F 1/187 361/747 |
| 2014/0098489 A1* | 4/2014 | Chiriac | G06F 1/203 361/679.54 |
| 2014/0203696 A1* | 7/2014 | Rust | H05K 7/1421 312/330.1 |
| 2015/0043151 A1* | 2/2015 | Cravens | G06F 1/187 361/679.37 |
| 2015/0268703 A1* | 9/2015 | Tu | G11B 33/124 361/679.38 |
| 2016/0057886 A1* | 2/2016 | Harvilchuck | G06F 1/185 361/679.31 |
| 2016/0291644 A1* | 10/2016 | Weber | B29C 45/14 |
| 2017/0038802 A1 | 2/2017 | Kwon et al. | |
| 2017/0060195 A1 | 3/2017 | Kim | |
| 2017/0060199 A1 | 3/2017 | Kim | |
| 2017/0220505 A1* | 8/2017 | Breakstone | G06F 13/16 |
| 2018/0053533 A1* | 2/2018 | Smith | G06F 1/182 |
| 2019/0025893 A1* | 1/2019 | Smith | G06F 1/203 |

* cited by examiner

US 10,986,740 B2

SOLID STATE DRIVE DEVICE AND DATA STORAGE SYSTEM INCLUDING THE SAME

CROSS-REFERENCE TO RELATED APPLICATION

This application claims the benefit of Korean Patent Application No. 10-2018-0014721, filed on Feb. 6, 2018, in the Korean Intellectual Property Office, the disclosure of which is incorporated herein in its entirety by reference.

BACKGROUND

The inventive concepts relate to data storage systems and solid state drive devices accommodated therein.

Solid state drive devices have attracted attention as a next generation storage device to replace a hard disk drive. The solid state drive device is a non-volatile memory-based storage device with low power consumption and high storage density. When solid state drive devices are used as storage devices, input/output of a large amount of data may be performed at a high speed, and thus, demand for solid state drive devices may be expected to increase.

Accordingly, solid state drive devices, instead of or in addition to hard disk drives, may be adopted as a data storage system.

SUMMARY

Embodiments of the inventive concepts provide a volume-reduced data storage system and a solid state drive device accommodated therein.

According to an aspect of the inventive concepts, there is provided a solid state drive device as described below and a data storage system including the solid state drive device. The solid state drive device includes: a housing including an inner space and first through fourth edges sequentially connected to each other; and a package substrate module accommodated in the inner space, the package substrate module including a package base substrate, a plurality of semiconductor chips mounted on the package base substrate, and an external connector corresponding to the third edge of the housing, wherein the housing includes at least one groove adjacent to the first edge and a rail unit on each of the second and fourth edges.

According to another aspect of the inventive concepts, there is provided a solid state drive device including: a housing including an inner space and first through fourth edges sequentially connected to each other, the housing including at least one groove adjacent to the first edge; a package substrate module accommodated in the inner space, the package substrate module including a package base substrate, a plurality of semiconductor chips mounted on the package base substrate, and an external connector corresponding to the third edge of the housing; and an insulating layer attached to a surface of the at least one groove of the housing, wherein the insulating layer includes a material having less heat conductivity than a material constituting the housing, and surface roughness of the insulating layer is greater than that of the housing.

According to another aspect of the inventive concepts, there is provided a data storage system including: a rack including a plurality of sliding units extending in a first direction on an inner side wall and limiting an inner accommodating space; a data management unit comprising a plurality of sockets installed thereon; and a plurality of solid state drive devices comprising: a housing including an inner space and first through fourth edges connected sequentially to each other; a plurality of semiconductor chips accommodated in the inner space and mounted on the package base substrate; and an external connector coupled with the socket, wherein the housing includes at least one groove adjacent to the first edge, a connector groove corresponding to the external connector on the third edge, and a rail unit corresponding to the sliding unit on each of the second edge and the fourth edge and extending in the first direction.

BRIEF DESCRIPTION OF THE DRAWINGS

Embodiments of the inventive concepts will be more clearly understood from the following detailed description taken in conjunction with the accompanying drawings in which.

DETAILED DESCRIPTION OF EMBODIMENTS

Figure 1:
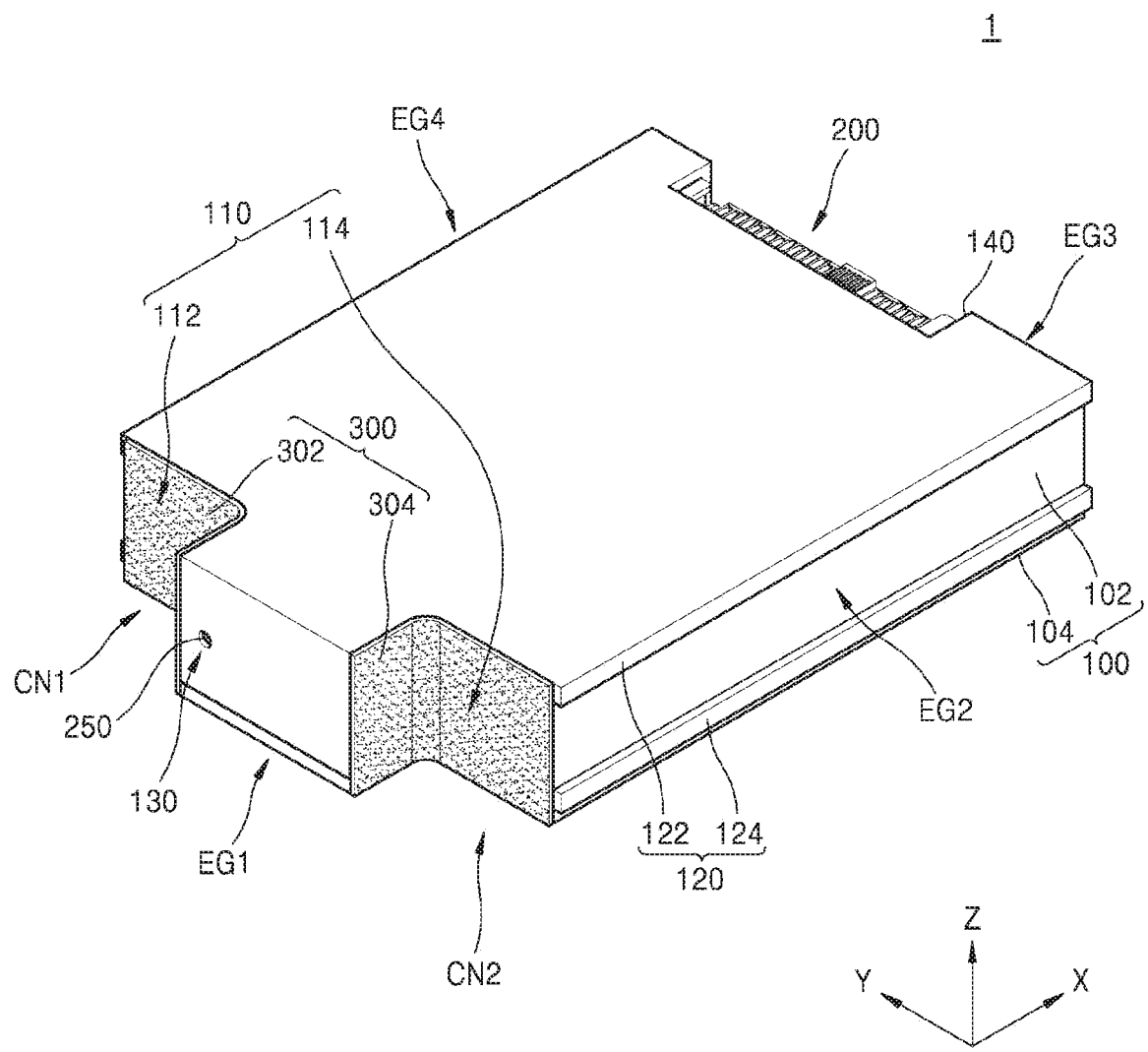
FIGS. 1 and 2 are a perspective view and an exploded perspective view, respectively, of a solid state drive device according to some embodiments.
Figure 2:
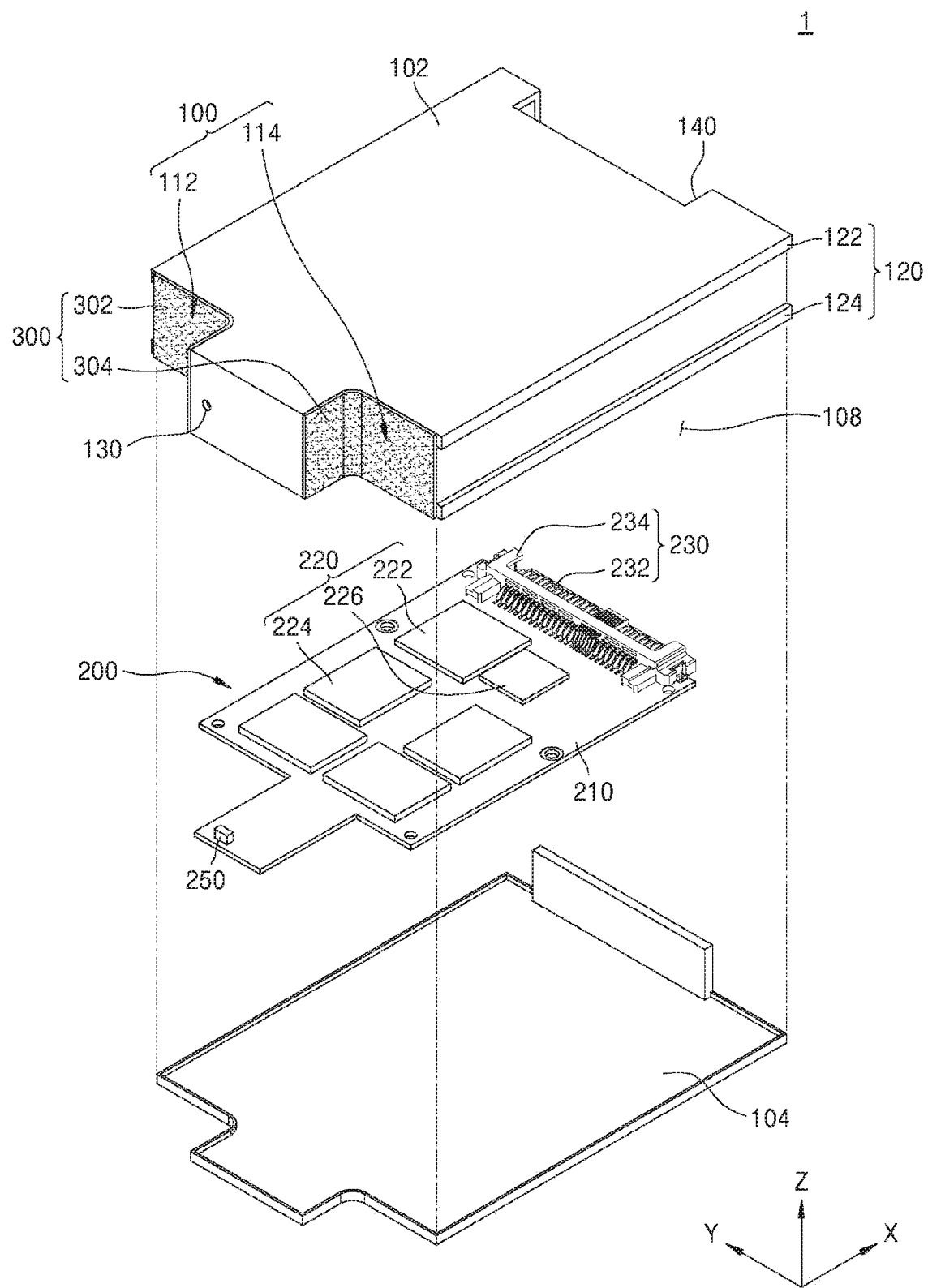

FIGS. 1 and 2 are a perspective view and an exploded perspective view, respectively, of a solid state drive device 1 according to some embodiments.

Referring to FIGS. 1 and 2, the solid state drive device 1 may include a housing 100 and a package substrate module 200 mounted in an inner space or interior space 108 of the housing 100.

The housing 100 (including variations 100b, 100c, and 100d herein) may include a single material or a combination of different materials considering heat transfer characteristics. The housing 100 may include a metal, a carbon-based material, a polymer material, or a combination thereof, but is not limited thereto. The housing 100 may include, for example, copper (Cu), aluminum (Al), zinc (Zn), tin (Sn), stainless steel or a clad metal including these and/or other materials. The housing 100 may include, for example, graphite, graphene, carbon fiber, carbon nano-tube composite (CNT composite), or the like. The housing 100 may include, for example, a polymer material such as epoxy resin, polymethylmethacrylate (PMMA), polycarbonate (PC), polyethylene (PE), polypropylene (PP), and the like.

The housing 100 may include a top cover 102 (including variations 102a, 102b, 102c, and 102d herein) and a bottom cover 104 (including variations 104b, 104c, and 104d herein) coupled with the top cover 102. The inside of the housing 100 may be enclosed by the top cover 102 and the bottom cover 104 and may include the interior space 108 in which the package substrate module 200 is accommodated. Note that spatially relative terms, such as "bottom," "beneath," "below," "lower," "top," "above," "upper" "higher," and the like, are intended to encompass different orientations of the device in use or operation in addition to the orientation depicted in the figures.

The solid state drive device 1 may include first through fourth edges EG1 through EG4 (i.e., first EG1, second EG2, third EG3, and fourth EG4 edges) that define a perimeter or periphery of the device 1. As used herein, the terms first, second, third, etc. are used merely to differentiate one direction, region, portion, or element from another. The first through fourth edges EG1 through EG4 may be sequentially connected to each other. Particularly, the first edge EG1 may be connected to the second and fourth edges EG2 and EG4, the second edge EG2 may be connected to the first and third edges EG1 and EG3, the third edge EG3 may be connected to the second and fourth edges EG2 and EG4, and the fourth edge EG4 may be connected to the first and third edges EG1 and EG3. The first edge EG1 may be arranged on one side in a first direction X and the third edge EG3 may be on the other side of the first edge EG1. The first and third edges EG1 and EG3 may extend along a second direction Y. In addition, the second edge EG2 may be arranged on one side in the second direction Y and the fourth edge EG4 may be on the other side of the second edge EG2. The second and fourth edges EG2 and EG4 may extend along the first direction X. The first edge EG1 of the solid state drive device 1 may be between a first corner CN1 and a second corner CN2.

Each of four sidewalls of the housing 100 may constitute or define at least a portion of the first through fourth edges EG1 through EG4. Most (e.g., a majority of) portions of the first through fourth edges EG1 through EG4 of the solid state drive device 1 may respectively define the four side walls of the housing 100. Thus, names of the first through fourth edges EG1 through EG4 of the housing 100 in this specification may respectively indicate portions of the first through fourth edges EG1 through EG4 of the solid state drive device 1, which are constituted or defined by the housing 100. Similarly, the first corner CN1 and the second corner CN2 of the housing 100 may respectively indicate portions of the first corner CN1 and the second corner CN2 of the solid state drive device 1, which are constituted or defined by the housing 100.

In the present specification, most (e.g., a majority of) portions of the first through fourth edges EG1 through EG4 of the housing 100 are illustrated as portions of the top cover 102, but embodiments are not limited thereto. One of ordinary skill in the art may modify or otherwise recognize configurations of the first through fourth edges EG1 through EG4 such that most (e.g., a majority of) portions of the first through fourth edges EG1 through EG4 are portions of the bottom cover 104, or the first through fourth edges EG1 through EG4 respectively constitute or define portions of the top cover 102 and portions of the bottom cover 104 in various shapes. That is, the edges EG1, EG2, EG3, and/or EG4 may be defined by portions of the top cover 102, portions of the bottom cover 104, and/or by portions of the top and bottom covers 102 and 104. However, for convenience of description, embodiments where a majority of the portions of the first through fourth edges EG1 through EG4 are portions of the top cover 102 will be described herein by way of example. Accordingly, the first through fourth edges EG1 through EG4 of the top cover 102 may indicate portions of the first through fourth edges EG1 through EG4, which are constituted or defined by the top cover 102. Similarly, the first corner CN1 and the second corner CN2 of the top cover 102 may indicate portions of the first corner CN1 and the second corner CN2, which are constituted or defined by the top cover 102.

The housing 100 may include at least one groove 110 adjacent or in the first edge EG1. In some embodiments, the at least one groove 110 may include a first groove 112 and a second groove 114. For example, the housing 100 may include the first groove 112 and the second groove 114 at the first corner CN1 and the second corner CN2, respectively. The first groove 112 may be between the first edge EG1 and the fourth edge EG4 of the housing 100, and the second groove 114 may be between the first edge EG1 and the second edge EG2 of the housing 100. However, the first groove 112 and the second groove 114 may be unconnected to each other and spaced apart from each other. In other words, the first edge EG1 may separate and protrude from the first and second grooves 112 and 114.

The housing 100 may include a rail unit 120 extending in the first direction X on each of the second edge EG2 and the fourth edge EG4. The rail unit 120 may include portions 122, 124 protruding outwardly from each of the second edge EG2 and the fourth edge EG4 of the housing 100. The rail unit 120 may correspond to (e.g., may be shaped or otherwise configured to mate with) a sliding unit 810 (in FIG. 8B) formed in a rack 800 (in FIG. 8B) of a data storage system 1000 (of FIG. 8B) so that the solid state drive device 1 is accommodated in the rack 800. The rail unit 120 may include the first rail 122 and the second rail 124 which are spaced apart from each other and extend in parallel with each other. In other words, on each of the second edge EG2 and the fourth edge EG4 of the housing 100, the first rail 122 and the second rail 124 may be formed spaced apart from each other, extending in parallel with each other in a direction (e.g., in the X direction) from the first edge EG1 to the third edge EG3, and protruding outwardly from each of the second edge EG2 and the fourth edge EG4. The rail units 120 may be integrated with or integral to the edges EG2 and EG4 of the housing 100 in some embodiments.

The housing 100 may have a through hole 130 in the first edge EG1 between the first groove 112 and the second groove 114. A light-emitting element 250 included in the package substrate module 200 may be exposed via the through hole 130.

The housing 100 may include a connector groove 140 in the third edge EG3 opposite to the first edge EG1. The connector groove 140 may penetrate the third edge EG3 of the housing 100 so as to connect the outside of the housing 100 to the interior space 108. That is, the connector groove 140 may expose the interior space 108 to the exterior of the housing 100. An external connector 230 attached to the package substrate module 200 may be arranged in and exposed by the connector groove 140.

The package substrate module 200 may be accommodated in the interior space 108 of the housing 100. The package substrate module 200 may include the package base substrate 210, a plurality of semiconductor chips 220 mounted on the package base substrate 210, and the external connector 230. The package substrate module 200 may be, for example, a single in-line memory module (SIMM) mounted on a top surface of the package base substrate 210, but is not limited thereto. For example, the package substrate module 200 may be a dual in-line memory module (DIMM) mounted on each of the top and bottom surfaces of the package base substrate 210.

A method or mechanism of mounting the plurality of semiconductor chips 220 on the package base substrate 210 may include ball grid array (BGA), pin grid array (PGA), tape carrier package (TCP), chip-on-board (COB), quad flat non-leaded (QFN), quad flat package (QFP), and the like, but is not limited thereto.

In some embodiments, the package base substrate 210 may be a printed circuit board (PCB). For example, the package base substrate 210 may be a double-sided PCB or a multi-layer PCB. The package base substrate 210 may include a substrate base including at least one of phenol resin, epoxy resin, or polyimide. The substrate base may include at least one of phenol resin, epoxy resin, or polyimide. The substrate base may include at least one of, for example, frame retardant 4 (FR4), tetrafunctional epoxy, polyphenylene ether, epoxy/polyphenylene oxide, bismaleimide triazine (BT), thermount, cyanate ester, polyimide, or liquid crystal polymer.

The package base substrate 210 may have a wiring pattern formed on the top and/or bottom surfaces of the substrate base. In some embodiments, when the substrate base includes a plurality of layers, the wiring pattern may be formed between the plurality of layers of the substrate base. One or more conductive vias connecting the wiring pattern may be formed on the substrate base in the package base substrate 210. The conductive vias may penetrate a whole portion or a portion (e.g., a sub portion or less than an entirety) of the substrate base to electrically connect the wiring pattern. The wiring pattern and/or the conductive vias may include copper, nickel, stainless steel, or beryllium copper.

A solder resist layer, which extends on or covers at least a portion of the wiring pattern arranged on the top and/or bottom surfaces of the substrate base, may be formed on the top and/or bottom surfaces of the package base substrate 210. A portion of the wiring pattern that is arranged on the top surface and/or the bottom surface of the substrate base and is not covered by the solder resist layer may be used as a pad to be electrically connected to a plurality of semiconductor chips 220, active elements, and/or passive elements, which may be attached to the top surface and/or the bottom surface of the package base substrate 210.

The plurality of semiconductor chips 220 may include at least one controller chip 222 and a plurality of first memory semiconductor chips 224. In some embodiments, the plurality of semiconductor chips 220 may further include at least one second memory semiconductor chip 226, which may be of a different memory type than the first memory semiconductor chips 224.

The at least one controller chip 222, the plurality of first memory semiconductor chips 224, and the at least one second memory semiconductor chip 226 may each include a semiconductor substrate. The semiconductor substrate may include, for example, silicon (Si). The semiconductor substrate may include a semiconductor element such as germanium (Ge), or a compound semiconductor such as silicon carbide (SiC), gallium arsenide (GaAs), indium arsenide (InAs), and indium phosphide. The semiconductor substrate may have an active surface and an inactive surface opposite to the active surface. Each of the at least one controller chip 222, the plurality of first memory semiconductor chips 224, and the at least one second memory semiconductor chip 226 may include a semiconductor element including various kinds of a plurality of individual devices on the active surface thereof.

The at least one controller chip 222 may control the plurality of first memory semiconductor chips 224 and at least one second memory semiconductor chip 226. A controller may be mounted inside or may otherwise be provided by the at least one controller chip 222. The controller may control access to data stored in the plurality of first memory semiconductor chips 224 and the at least one second memory semiconductor chip 226. The controller may control write/read operations of the plurality of first memory semiconductor chips 224, for example, a flash memory, etc. according to a control command of an external host. The controller may include a separate control semiconductor chip such as an application specific integrated circuit (ASIC). The controller may be designed to be automatically operated by an operating system of the external host, when, for example, the solid state drive device 1 is connected to the external host. The controller may provide standard protocols such as parallel advanced technology attachment (PATA), serial advanced technology attachment (SATA), small computer system interface (SCSI), and/or peripheral component interconnect bus (PCI) express (PCIe). In addition, the controller may perform wear leveling, garbage collection, bad block management, and/or error correcting code (ECC) on a non-volatile memory device. In this case, the controller may include a script for automatic execution and an application program executable in the external host.

The plurality of first memory semiconductor chips 224 may be non-volatile memory devices. The non-volatile memory device may include, for example, flash memory, phase change RAM (PRAM), resistive RAM (RRAM), ferroelectric RAM (FeRAM), magnetic RAM, MRAM), and the like, but is not limited thereto. The flash memory may be, for example, a NAND flash memory. The flash memory may be, for example, V-NAND flash memory. The non-volatile memory device may include one semiconductor die or a stack of several semiconductor dies.

The at least one second memory semiconductor chip 226 may be a volatile memory device. The volatile memory device may be, for example, dynamic RAM (DRAM), static RAM (SRAM), synchronous DRAM (SDRAM), double data rate RAM (DDR RAM), rambus DRAM (RDRAM), and the like, but is not limited thereto. The volatile memory device may provide a cache function to store data frequently used when the external host accesses the solid state drive device 1, thereby scaling access-time and data-transfer performance to match performance of the external host connected to the solid state drive device 1.

The package substrate module 200 may further include the light-emitting element 250 mounted on the package base substrate 210. The light-emitting element 250 may be mounted on the package base substrate 210 so as to be aligned with or otherwise correspond to the through hole 130 toward the first edge EG1 of the housing 100. In other words, the light-emitting element 250 and the external connector 230 included in the package substrate module 200 may be adjacent or otherwise correspond to the first edge EG1 and the third edge EG3 of the housing 100, respectively.

The light-emitting element 250 may include, for example, a light-emitting diode (LED), an organic LED (OLED), a monochromatic light source, or a white light source. The light-emitting element 250 may emit light when the solid state drive device 1 is normally or properly connected to the rack 800 of the data storage system 1000.

The package substrate module 200 may further include active elements or passive elements such as a chip resistor, a chip capacitor, an inductor, a switch, a temperature sensor, a DC-DC converter, quartz for clock generation, and/or a voltage regulator, which are mounted on the package base substrate 210.

An insulating layer 300 may be attached to or otherwise present on a surface of the groove 110 of the housing 100. The insulating layer 300 may include a first insulating layer 302 attached to the surface of the first groove 112 and a second insulating layer 304 attached to the surface of the second groove 114. The insulating layer 300 may include a material having a thermal conductivity that is less/lower than that of a material forming the housing 100. Surface roughness of the insulating layer 300 may be greater than that of the housing 100. The insulating layer 300 may include, for example, a polymer material having a low thermal conductivity. In some embodiments, the insulating layer 300 may include silicone. The insulating layer 300 may be, for example, a film having an adhesive layer facing the surface of the housing 100.

The solid state drive device 1 according to embodiments of the inventive concepts may be accommodated in the rack 800 of the data storage system 1000 via the rail unit 120 without a separate carrier device. In addition, the solid state drive device 1 may be separated from the rack 800 of the data storage system 1000 by using, as a handle, a portion of the first edge EG1 of the housing 100 between the first groove 112 and the second groove 114. That is, one or more of the grooves described herein may define a handle for the solid state drive device 1 that is an integral portion of the housing 100. Accordingly, an accommodating space 850 (in FIG. 8A) of and within the rack 800 in which the solid state drive device 1 is accommodated may be reduced, and thus, a volume of the data storage system 1000 may be reduced. In other words, by eliminating the interface with a separate carrier device and/or a separate handle, the data storage system 1000 having a larger storage capacity in an identical space may be installed.

In addition, since the first insulating layer 302 and the second insulating layer 304 having a material of less or lower thermal conductivity than the material forming the housing 100 are attached to or otherwise present on the surfaces of the first grove unit 112 and the second groove 114, respectively, it may be possible to prevent or reduce the risk of a worker, who separates the solid state drive device 1 from the rack 800 of the data storage system 1000 by hand, from being burned by heat generated in the plurality of semiconductor chips 220. Since the first insulating layer 302 and the second insulating layer 304 have greater surface roughness than that of the housing 100, it may provide increased grip such that it may be possible to prevent or reduce the risk of a hand or a separating tool from slipping away from the solid state drive device 1, in a process of separating the solid state drive device 1 from the rack 800 of the solid state drive device 1.

Figure 3:
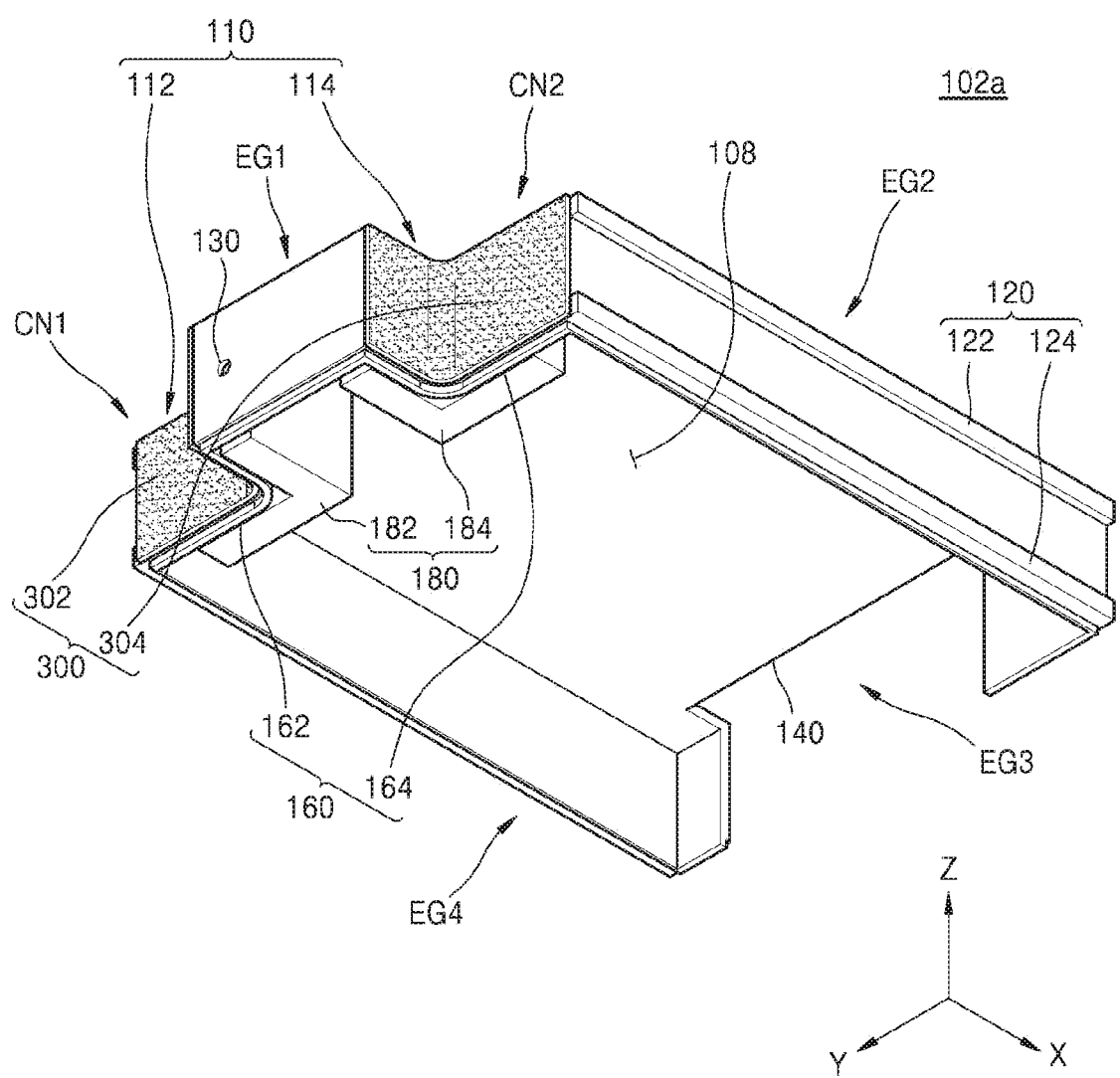
FIG. 3 is a perspective view illustrating a top cover of the solid state drive device according to some embodiments.

FIG. 3 is a perspective view illustrating an underside view of a top cover 102a of the solid state drive device 1 according to some embodiments. Descriptions with respect to FIG. 3 which are the same as those given with respect to FIGS. 1 and 2 are omitted.

Referring to FIG. 3, the top cover 102a may include the first groove 112 and the second groove 114 in or adjacent the first edge EG1 at the first corner CN1 and the second corner CN2, respectively.

The top cover 102a may include the rail units 120 extending in the first direction X on the second edge EG2 and the fourth edge EG4, respectively. The rail unit 120 may include portions protruding outwardly from the second edge EG2 and the fourth edge EG4, respectively. The rail unit 120 may include the first rail 122 and the second rail 124 which are spaced apart and extend in parallel. In other words, on each of the second edge EG2 and the fourth edge EG4 of the top cover 102a, the first rail 122 and the second rail 124 may be formed which are spaced apart from each other and extend in parallel with each other and protrude outwardly (e.g., away from the edges EG2 and EG4).

The top cover 102a may have the through hole 130 in the first edge EG1 between the first groove 112 and the second groove 114. The top cover 102a may include the connector groove 140 in the third edge EG3 opposite to the first edge EG1. The connector groove 140 may penetrate the third edge EG3 of the top cover 102a to expose or connect the interior space 108 to the exterior of the top cover 102a.

The insulating layer 300 may be attached to or otherwise present on the surface of the groove 110 of the top cover 102a. The insulating layer 300 may include the first insulating layer 302 attached to the surface of the first groove 112 and the second insulating layer 304 attached to the surface of the second groove 114.

An insulating structure 180 may be arranged on an inner surface portion of the interior space 108 of the top cover 102a corresponding to the insulating layer 300, that is, on an inner surface portion 160 of the top cover 102a. The insulating structure 180 may include a first insulating structure 182 and a second insulating structure 184 which are arranged on a first surface portion 162 and a second surface portion 164, which are portions of the inner surface of the top cover 102a corresponding to the first insulating layer 302 and the second insulating layer 304, respectively.

The insulating structure 180 may include, for example, a material having less or lower thermal conductivity than the material of the top cover 102a. In some embodiments, the insulating structure 180 may include a polymeric material such as plastic. The insulating structure 180 may be formed together with the top cover 102a by, for example, heterogeneous injection. In some embodiments, the insulating structure 180 may be separately formed and then adhered to the inner surface portion 160 of the top cover 102a.

The top cover 102 of the solid state drive device 1 illustrated in FIGS. 1 and 2 may be replaced by the top cover 102a illustrated in FIG. 3. In some embodiments, the insulating structure 182 may be attached to the inner surface of the top cover 102 of the solid state drive device 1 illustrated in FIGS. 1 and 2. The insulating structure 180 may be arranged between the top cover 102 and the package substrate module 200 (in FIG. 2), thereby preventing heat transfer from the package substrate module 200 to the first edge EG1 of the top cover 102.

Figure 4:
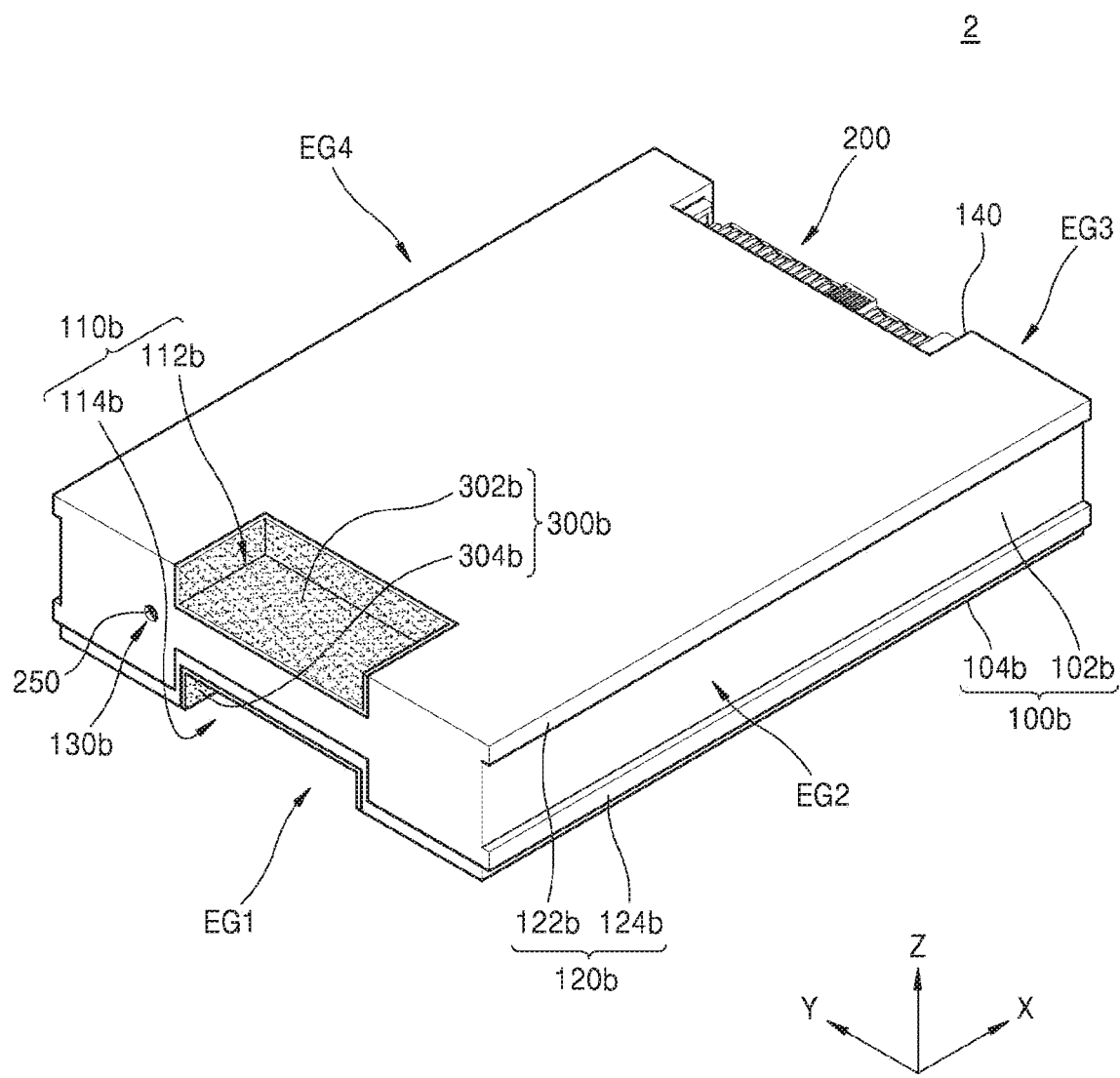
FIGS. 4 and 5 are a perspective view and an exploded perspective view, respectively, of a solid state drive device according to some embodiments.
Figure 5:
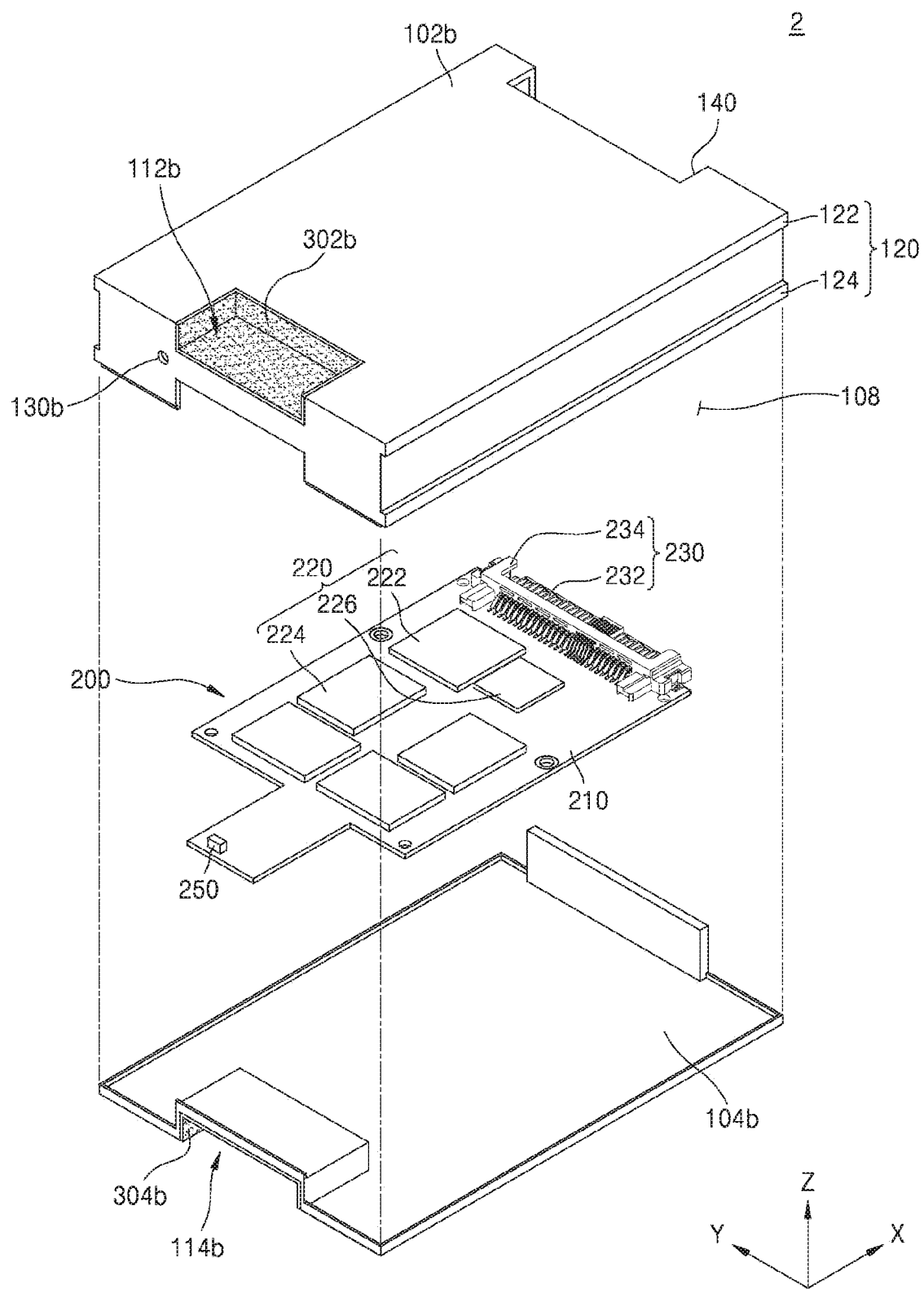

FIGS. 4 and 5 are a perspective view and an exploded perspective view, respectively, of a solid state drive device 2 according to some embodiments. Descriptions with respect to FIGS. 4 and 5 which are the same as those given with respect to FIGS. 1 and 2 are omitted.

Referring to FIGS. 4 and 5, the solid state drive device 2 may include a housing 100b and a package substrate module 200 mounted in the interior space 108 of the housing 100b.

The housing 100b may include a top cover 102b and a bottom cover 104b coupled with the top cover 102b. The inside of the housing 100b may be enclosed by the top cover 102b and the bottom cover 104b and may include the interior space 108 in which the package substrate module 200 is accommodated.

The solid state drive device 2 may include the first through fourth edges EG1 through EG4.

The housing 100b may include at least one groove 110b adjacent the first edge EG1. In some embodiments, the at least one groove 110b may include a first groove 112b and a second groove 114b. For example, the housing 100b may include the first groove 112b and the second groove 114b on a top side and a bottom side of the first edge EG1, respectively. The first groove 112b may between a top surface of the housing 100b and the first edge EG1, and the second groove 114b may be between a bottom surface of the housing 100b and the first edge EG1. The first groove 112b and the second groove 114b may be separated from each other and not be connected to each other.

The housing 100b may include a rail unit 120b extending in the first direction X on each of the second edge EG2 and the fourth edge EG4. The rail unit 120b may include portions protruding outwardly from each of the second edge EG2 and the fourth edge EG4 of the housing 100b. The rail unit 120b may correspond to (e.g., may be shaped or otherwise configured to mate with) the sliding unit 810 (in FIG. 8B) formed in the rack 800 (in FIG. 8B) of the data storage system 1000 (of FIG. 8B) so that the solid state drive device 2 is accommodated in the rack 800. The rail unit 120b may include the first rail 122b and the second rail 124b, which are spaced apart from each other and extend in parallel with each other. In other words, on each of the second edge EG2 and the fourth edge EG4 of the housing 100b, the first rail 122b and the second rail 124b may be formed which are spaced apart from each other and extend in parallel and protrude outwardly (e.g., away from the edges EG2 and EG4).

The housing 100b may have a through hole 130b in the first edge EG1. The light-emitting element 250 included in a package substrate module 200 may be exposed via the through hole 130b.

The housing 100b may include the connector groove 140 in the third edge EG3 opposite to the first edge EG1. The connector groove 140 may penetrate the third edge EG3 of the housing 100b so as to connect or expose the outside of the housing 100b to the interior space 108. The external connector 230 attached to the package substrate module 200 may be arranged in and exposed by the connector groove 140.

The package substrate module 200 may be accommodated in the interior space 108 of the housing 100b. The package substrate module 200 may include the package base substrate 210, the plurality of semiconductor chips 220 mounted on the package base substrate 210, and the external connector 230.

The plurality of semiconductor chips 220 may include the at least one controller chip 222 and the plurality of first memory semiconductor chips 224. In some embodiments, the plurality of semiconductor chips 220 may further include at least one second memory semiconductor chip 226, which may be of a different memory type than the first memory semiconductor chips 224.

The package substrate module 200 may further include the light-emitting element 250 mounted on the package base substrate 210. The light-emitting element 250 may be mounted on the package base substrate 210 toward the first edge EG1 of the housing 100b so as to correspond to or otherwise be aligned with the through hole 130. The light-emitting element 250 may emit light when the solid state drive device 2 is normally or properly connected to the rack 800 of the data storage system 1000.

An insulating layer 300b may be attached to or otherwise present on a surface of the groove 110b of the housing 100b. The insulating layer 300b may include a first insulating layer 302b attached to the surface of the first groove 112b and a second insulating layer 304b attached to the surface of the second groove 114b. The insulating layer 300b may include a material having thermal conductivity that is less/lower than that of a material forming the housing 100b. Surface roughness of the insulating layer 300b may be greater than that of the housing 100b.

The solid state drive device 2 according to embodiments of the inventive concepts may be accommodated in the rack 800 of the data storage system 1000 via the rail unit 120b without a separate carrier device. In addition, the solid state drive device 2 may be separated from the rack 800 of the data storage system 1000 by using, as the handle, a portion of the first edge EG1 of the housing 100b between the first groove 112b and the second groove 114b. Accordingly, an accommodating space 850 (in FIG. 8A) of the rack 800 in which the solid state drive device 2 is accommodated may be reduced, and thus, a volume of the data storage system 1000 may be reduced. In other words, the data storage system 1000 having a larger storage capacity in an identical space may be installed.

In addition, since the first insulating layer 302b and the second insulating layer 304b having a material of less thermal conductivity than the material forming the housing 100b are attached to or otherwise present on the surfaces of the first groove 112b and the second groove 114b, it may be possible to prevent (or reduce a likelihood of) a worker, who separates the solid state drive device 2 from the rack 800 of the data storage system 1000 by hand, from being burned by heat generated in the plurality of semiconductor chips 220. Since the first insulating layer 302b and the second insulating layer 304b have greater surface roughness than the housing 100b, it may be possible to reduce or prevent a hand from slipping away from the solid state drive device 2, in a process of separating the solid state drive device 2 from the rack 800 of the solid state drive device 1.

In some embodiments, the insulating structure 180 as illustrated in FIG. 3 may be arranged on the inner surface of the top cover 102b corresponding to the groove 110b of the housing 100b.

Figure 6:
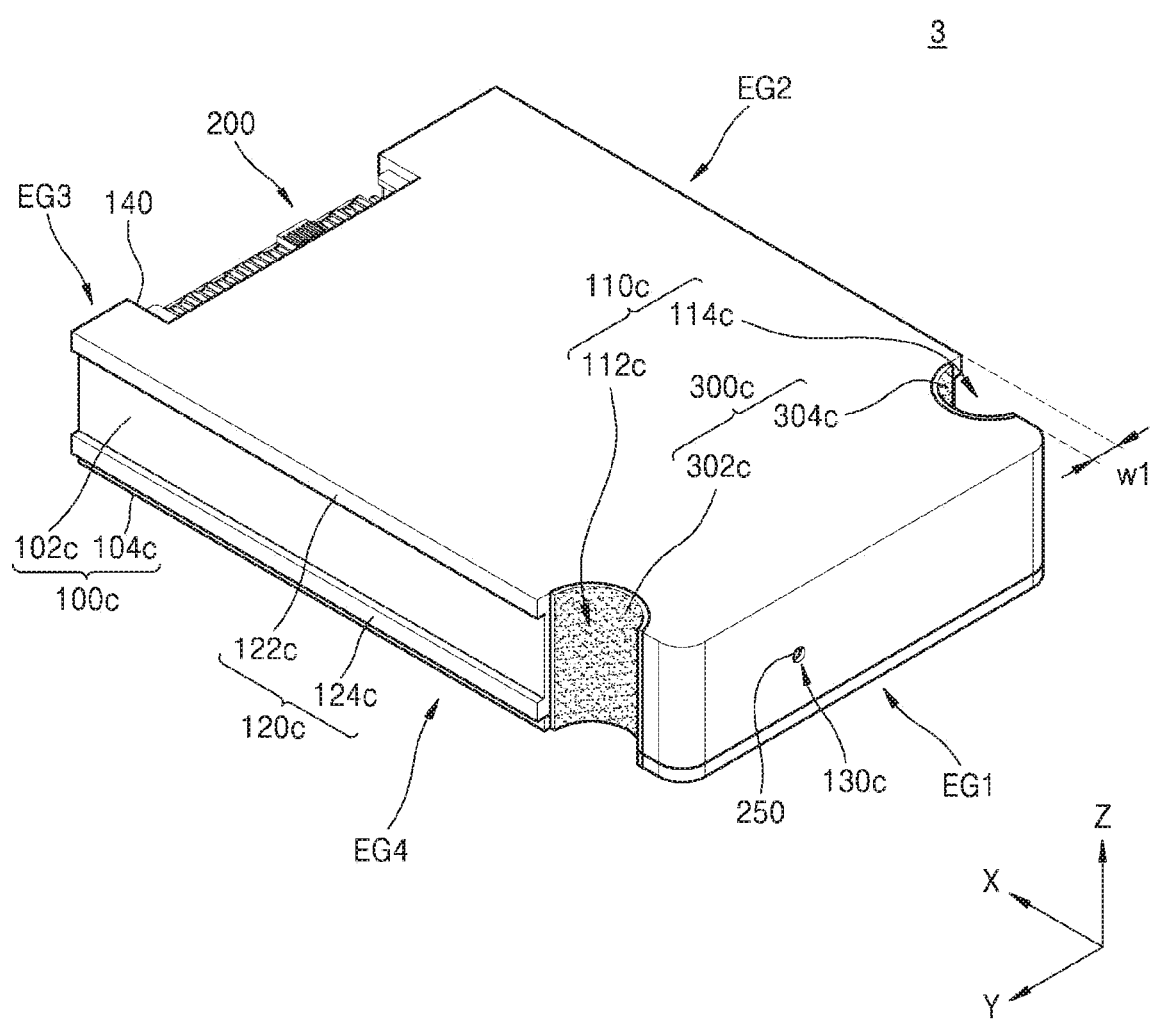
FIG. 6 is a perspective view of a solid state drive device according to some embodiments.

FIG. 6 is a perspective view of a solid state drive device 3 according to some embodiments. Descriptions with respect to FIG. 6 which are the same as those given with respect to FIGS. 1 and 2 are omitted.

Referring to FIG. 6, the solid state drive device 3 may include a housing 100c and the package substrate module 200 mounted in an interior space of the housing 100c.

The housing 100c may include a top cover 102c, and a bottom cover 104c coupled with the top cover 102c. An inside of the housing 100c may be enclosed by the top cover 102c and the bottom cover 104c and may include the interior space 108 (in FIG. 2) in which the package substrate module 200 is accommodated.

The solid state drive device 3 may include the first through fourth edges EG1 through EG4.

The housing 100c may include at least one groove 110c adjacent the first edge EG1. In some embodiments, the at least one groove 110c may include a first groove 112c and a second groove 114c. For example, the housing 100c may include a first groove 112c and a second groove 114c on the fourth edge EG4 and the second edge EG2 adjacent to the first edge EG, respectively. The first groove 112c and the second groove 114c may be separated from each other and may not be connected to each other.

Portions of the second edge EG2 and the fourth edge EG4 of the housing 100c which are closer to the third edge EG3 than to the first edge EG1 with respect to the groove 110c may protrude further outwardly by a first width W1 in the second direction Y. In other words, a horizontal width of the housing 100c in the second direction (Y) may be less at a portion adjacent to the first edge EG1 than that that at a portion adjacent to the third edge EG3 with respect to the groove 110c of the housing 100c. A worker separating the solid state drive device 3 from the rack 800 (in FIG. 8B) of the data storage system 1000 (in FIG. 8B) may insert a hand or a separating tool through a space generated or allowed by the first width W1 at the portion adjacent to the first edge EG1 of the housing 100c with respect to the groove 110c. In addition, the portion adjacent to the first edge EG1 of the housing 100c with respect to the groove 110c may have a hook shape due to the groove 110c. Accordingly, a worker may more easily separate the solid state drive device 3 from the rack 800 of the data storage system 1000 by using the portion having the hook shape and being adjacent to the first edge EG1 of the housing 100c.

The housing 100c may include a rail unit 120c extending in the first direction X on each of the second edge EG2 and the fourth edge EG4. The rail unit 120c may include portions protruding outwardly from each of the second edge EG2 and the fourth edge EG4 of the housing 100c. The rail unit 120c may correspond to (e.g., may be shaped or otherwise configured to mate with) the sliding unit 810 (in FIG. 8B) formed in the rack 800 (in FIG. 8B) of the data storage system 1000 (of FIG. 8B) so that the solid state drive device 3 is accommodated in the rack 800. The rail unit 120c may include a first rail 122c and a second rail 124c which are spaced apart from each other and extend in parallel with each other. In other words, on each of the second edge EG2 and the fourth edge EG4 of the housing 100c, the first rail 122c and the second rail 124c may be formed which are spaced apart from each other and extend in parallel and protrude outwardly (e.g., away from the edges EG2 and EG4).

The housing 100c may have a through hole 130c in the first edge EG1. The light-emitting element 250 (in FIG. 2) included in a package substrate module 200 may be exposed via a through hole 130c.

The housing 100c may include the connector groove 140 in the third edge EG3 opposite to the first edge EG1. The connector groove 140 may penetrate the third edge EG3 of the housing 100c so as to connect or expose the outside of the housing 100c to the interior space 108. The external connector 230 (in FIG. 2) attached to the package substrate module 200 may be arranged in and exposed by the connector groove 140.

An insulating layer 300c may be attached to or otherwise present on a surface of the groove 110c of the housing 100c. The insulating layer 300c may include the first insulating layer 302c attached to the surface of the first groove 112c and the second insulating layer 304c attached to the surface of the second groove 114c. The insulating layer 300c may include a material having thermal conductivity that is less/lower than that of a material forming the housing 100c. Surface roughness of the insulating layer 300c may be greater than that of the housing 100c.

The solid state drive device 3 according to embodiments of the inventive concepts may be accommodated in the rack 800 of the data storage system 1000 via the rail unit 120c without a separate carrier device. In addition, a worker may separate the solid state drive device 3 from the rack 800 of the data storage system 1000 by using the portion having the hook shape and being adjacent to the first edge EG1 of the housing 100c. Accordingly, the accommodating space 850 of the rack 800 in which the solid state drive device 3 is accommodated may be reduced, and thus, a volume of the data storage system 1000 may be reduced. In other words, the data storage system 1000 having a larger storage capacity in an identical space may be installed.

In addition, since the first insulating layer 302c and the second insulating layer 304c having a material of less thermal conductivity than the material forming the housing 100c are attached to or otherwise present on the surfaces of the first groove 112c and the second groove 114c, respectively, it may be possible to prevent (or reduce a likelihood of) a worker, who separates the solid state drive device 3 from the rack 800 of the data storage system 1000 by hand, from being burned. Since the first insulating layer 302c and the second insulating layer 304c have greater surface roughness than the housing 100c, it may be possible to reduce or prevent a hand or a separating tool from slipping away from the solid state drive device 3, in a process of separating the solid state drive device 3 from the rack 800 of the solid state drive device 1.

In some embodiments, the insulating structure 180 as illustrated in FIG. 3 may be arranged on the inner surface of the top cover 102c corresponding to the groove 110c of the housing 100c.

Figure 7:
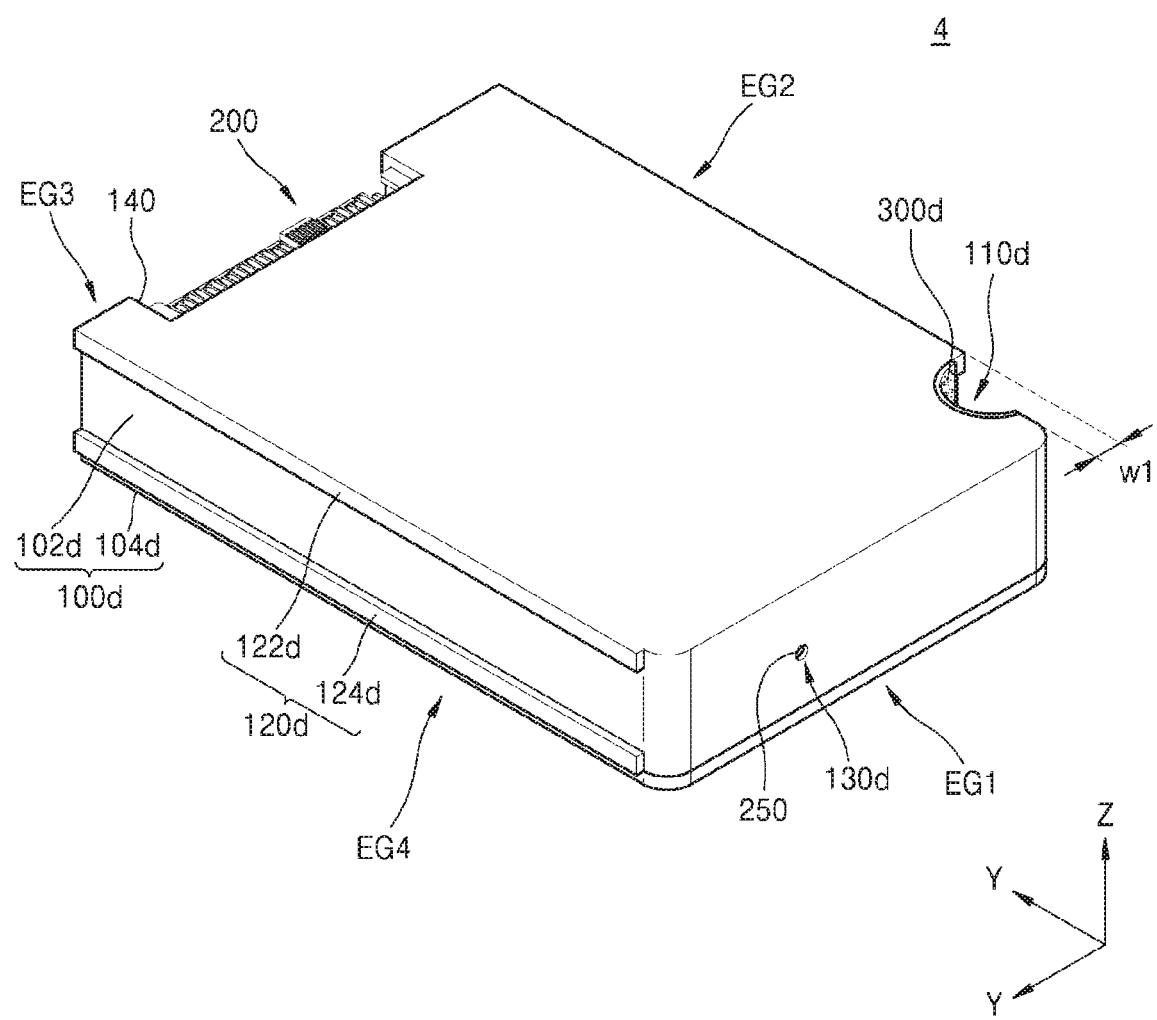
FIG. 7 is a perspective view of a solid state drive device according to some embodiments.

FIG. 7 is a perspective view of a solid state drive device 4 according to some embodiments. Descriptions with respect to FIG. 7 which are the same as those given with respect to FIG. 6 are omitted.

Referring to FIG. 7, the solid state drive device 4 may include a housing 100d and the package substrate module 200 mounted in an interior space of the housing 100d.

The housing 100d may include a top cover 102d, and a bottom cover 104d coupled with the top cover 102d.

The solid state drive device 4 may include the first through fourth edges EG1 through EG4. The housing 100d may include a groove 110d adjacent to the first edge EG1. For example, the housing 100d may include the groove 110d in the second edge EG2 adjacent to the first edge EG1. In some embodiments, the housing 100d may include, for example, the groove 110d in the fourth edge EG4 adjacent to the first edge EG1.

The housing 100d may include a rail unit 120d extending in the first direction X on each of the second edge EG2 and the fourth edge EG4. The rail unit 120d may include portions protruding outwardly from each of the second edge EG2 and the fourth edge EG4 of the housing 100d. The rail unit 120d may correspond to (e.g., may be shaped or otherwise configured to mate with) the sliding unit 810 (in FIG. 8B) formed in the rack 800 (in FIG. 8B) of the data storage system 1000 (of FIG. 8B) so that the solid state drive device 4 is accommodated in the rack 800. The rail unit 120d may include a first rail 122d and a second rail 124d which are spaced apart from each other and extend in parallel with each other. In other words, on each of the second edge EG2 and the fourth edge EG4 of the housing 100d, the first rail 122d and the second rail 124d may be formed which are spaced apart from each other and extend in parallel and protrude outwardly (e.g., away from the edges EG2 and EG4).

The housing 100d may have a through hole 130d in the first edge EG1. The light-emitting element 250 (in FIG. 2) included in the package substrate module 200 may be exposed via the through hole 130d.

The housing 100d may include the connector groove 140 in the third edge EG3 opposite to the first edge EG1. The connector groove 140 may penetrate the third edge EG3 of the housing 100d so as to connect or expose the outside of the housing 100d to the interior space 108. The external connector 230 (in FIG. 2) attached to the package substrate module 200 may be arranged in and exposed by the connector groove 140.

An insulating layer 300d may be attached to or otherwise present on a surface of the groove 110d of the housing 100d. The insulating layer 300d may include a material having thermal conductivity that is less/lower than that of a material forming the housing 100d. Surface roughness of the insulating layer 300d may be greater than that of the housing 100d.

The solid state drive device 4 according to embodiments of the inventive concepts may be accommodated in the rack 800 of the data storage system 1000 via the rail unit 120d without a separate carrier device. In addition, a worker may separate the solid state drive device 4 from the rack 800 of the data storage system 1000 by using the portion having the hook shape and being adjacent to the first edge EG1 of the housing 100d. Accordingly, the accommodating space 850 of the rack 800 in which the solid state drive device 4 is accommodated may be reduced, and thus, a volume of the data storage system 1000 may be reduced. In other words, the data storage system 1000 having a larger storage capacity in an identical space may be installed.

In addition, since the insulating layer 300d having less thermal conductivity than a material forming the housing 100d is attached to or otherwise present on the surface of the groove 110d and the second groove 114c, it may be possible to prevent (or reduce a likelihood of) a worker, who separates the solid state drive device 4 from the rack 800 of the data storage system 1 by hand, from being burned. Since the insulating layer 300d has greater surface roughness than the housing 100d, it may be possible to reduce or prevent a hand or a separating tool from slipping away from the solid state drive device 4, in a process of separating the solid state drive device 3 from the rack 800 of the solid state drive device 1000 by a worker using a hand or a separating tool.

In some embodiments, the insulating structure 180 as illustrated in FIG. 3 may be arranged on the inner surface of the top cover 102d corresponding to the groove 110d of the housing 100d.

Figure 8A:
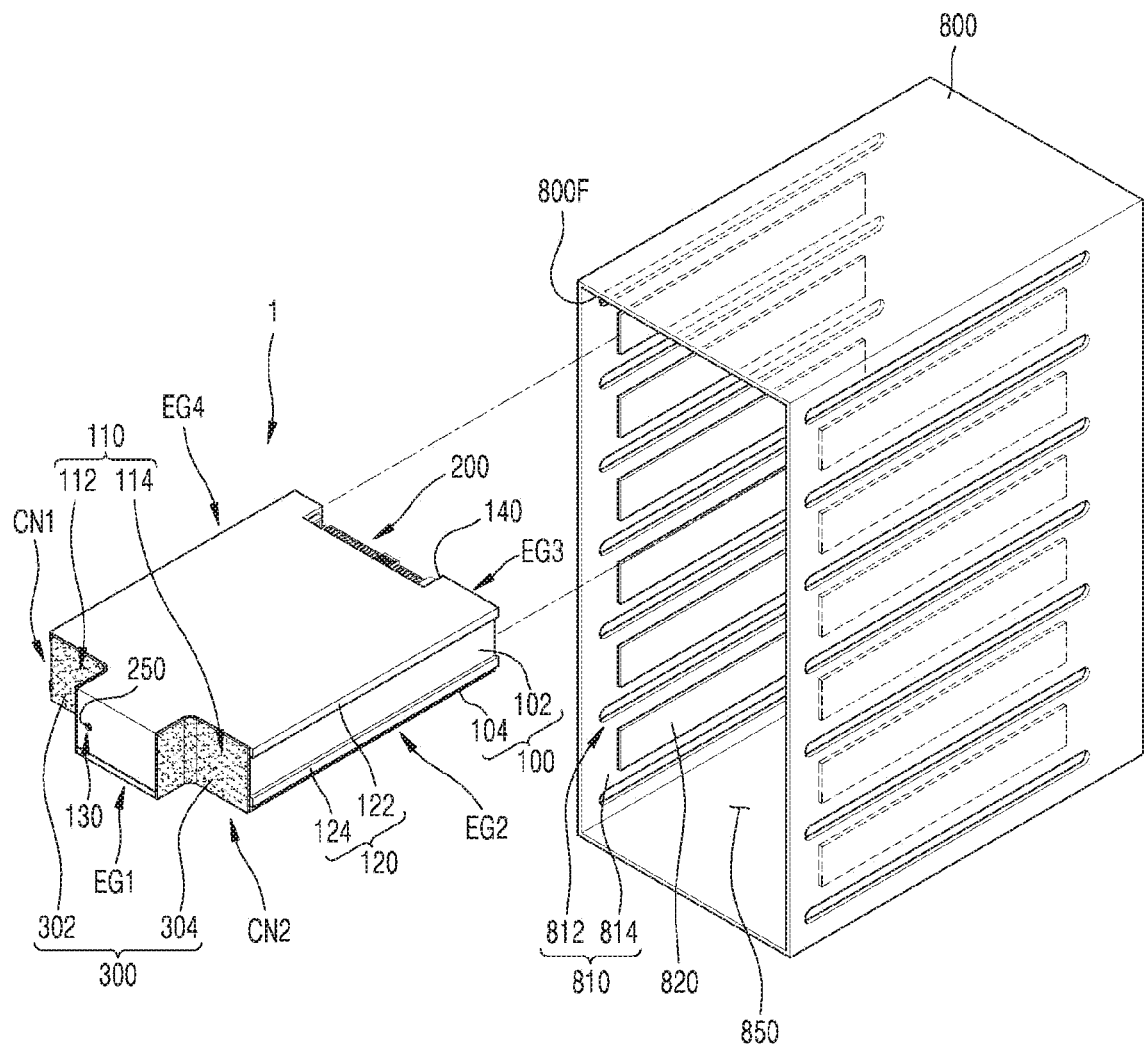
FIG. 8A is a perspective view illustrating a method in which a solid state drive device according to some embodiments is coupled with a rack of a data storage system.

FIG. 8A is a perspective view illustrating a method in which a solid state drive device 1 according to some embodiments is coupled with the rack 800 of the data storage system 1000.

Referring to FIG. 8A, the rack 800 of the data storage system 1000 (of FIG. 8B) may include the accommodating space 850 therein and a plurality of sliding units 810 extending in the first direction X. The sliding unit 810 may include a first sliding unit 812 and a second sliding unit 814, which are spaced apart from each other by a protruding structure unit 820 of an inner side wall of the rack 800 and extend in parallel with each other in the first direction X. As shown in FIG. 8A, the first sliding unit 812, the second sliding unit 814, and/or the protruding structure unit 820 therebetween may be defined in or otherwise integrated in opposing sidewalls of the rack 800 in some embodiments, for example, to save space.

The solid state drive device 1 may be pushed into the accommodating space 850 of the rack 800 such that the third edge EG3 on which the external connector 230 (in FIG. 2) is arranged faces the rack 800. The solid state drive device 1 may be installed in the accommodating space 850 such that a rack front edge unit 800F which defines the accommodating space 850 inside the rack 800 and the first edge EG1 are aligned in a vertical direction Z.

The rail unit 120 of the solid state drive device 1 may be coupled with (e.g., configured to interface or mate with) the sliding unit 810 corresponding thereto. For example, the first rail 122 and the second rail 124 of the rail unit 120 may be directly coupled with a first sliding unit 812 and a second sliding unit 814 of the sliding unit 810, respectively. In other words, the sliding unit 810 may include recesses as the first and second sliding units 812 and 814 (and a protruding structure unit 820 therebetween) that are sized and configured to directly accept and slidably engage with the protruding rail units 122 and 124 (and the recessed surface therebetween) of the rail unit 120, respectively, without the use of an intervening carrier device. The terms "directly on" or "directly adjacent" or "directly coupled" may mean that there are no intervening elements present between two elements. In contrast, when an element is referred to as being "on" or "adjacent" or "coupled to" another element, intervening elements may be present.

Since the solid state drive device 1 is installed to be accommodated in the rack 800 by a direct coupling of the rail part 120 and the sliding unit 810, the solid state drive device 1 may be accommodated in the rack 800 without a separate carrier device. That is, the housings 100 of the solid state drive devices and the rack 800 may each be free of interfaces with a separate carrier device.

In addition, when the solid state drive device 1 installed in the rack 800 is to be separated, portions of the first edge EG1 of the housing 100 between the first groove 112 and the second groove 114 may define or may otherwise be used as an integrated handle so as to separate the solid state drive device 1 from the rack 800 of the data storage system 1000. The housing 100, the grooves 112, 114, and the rail units 120 may be defined by a unitary member in some embodiments.

The solid state drive device 1 according to embodiments of the inventive concepts may be installed in and separated from the rack 800 without a separate carrier device, and thus a space for the separate carrier device in the rack 800 may not be required. Accordingly, the accommodating space 850 of the rack 800 in which the solid state drive device 1 is accommodated may be reduced.

Figure 8B:
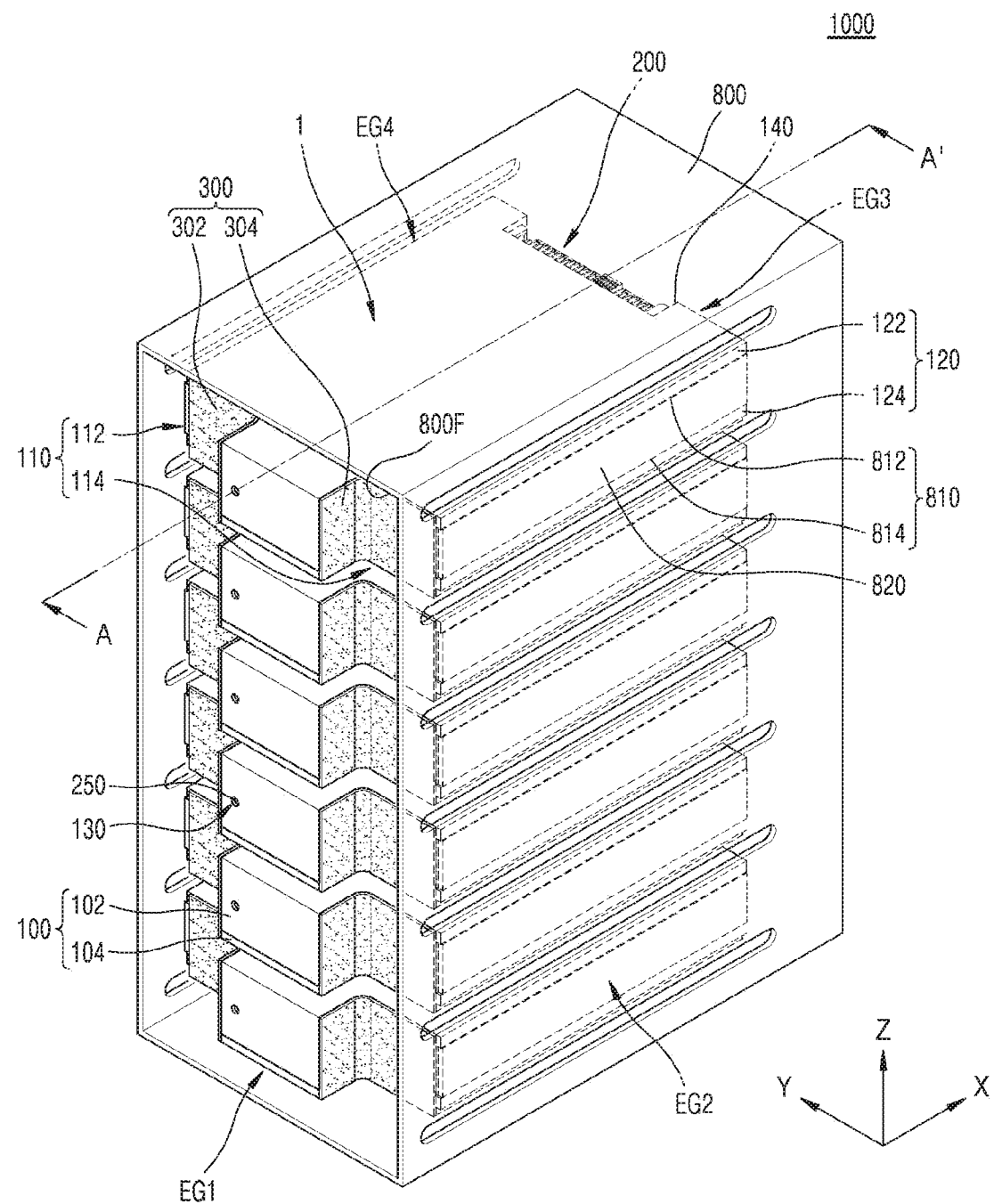
FIG. 8B is a perspective view illustrating a data storage system including a solid state drive device according to some embodiments.
Figure 8C:
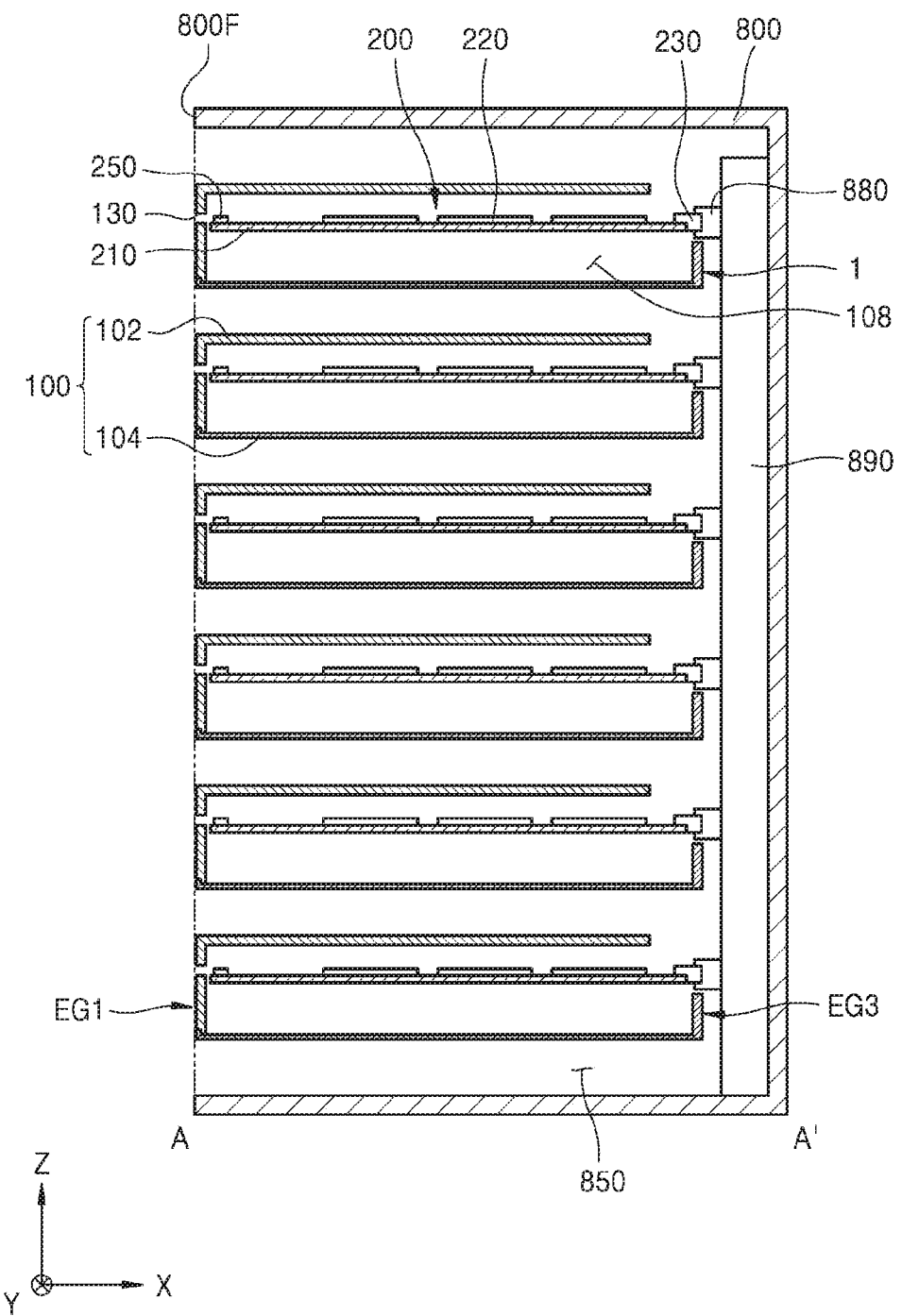
FIG. 8C is a cross-sectional view illustrating a data storage system including a solid state drive device according to some embodiments taken along the line A-A' in FIG. 8B.

FIGS. 8B and 8C are a perspective view and a cross-sectional view illustrating the data storage system 1000 including the solid state drive device 1 according to some embodiments. Particularly, FIG. 8C is a cross-sectional view of the data storage system 1000 taken along the line A-A' in FIG. 8B.

Referring to FIGS. 8B and 8C, the data storage system 1000 may include the rack 800 and the plurality of solid state drive devices 1 accommodated in the accommodating space 850 in the rack 800. The data storage system 1000 may further include a data management unit 890 on which a plurality of sockets 880 are installed. The data management unit 890 may control and manage the plurality of solid state drive devices 1 installed in the data storage system 1000 and supply power to the plurality of solid state drive devices 1.

The plurality of solid state drive devices 1 may be installed in the accommodating space 850 of the rack 800, being spaced from each other in a third direction Z. The external connectors 230 on the third edge EG3 of the plurality of solid state drive devices 1 may be coupled with the plurality of sockets 880.

When the external connector 230 of the solid state drive device 1 is normally or properly coupled with the socket 880, light may be generated in the light-emitting element 250. Thus, a worker installing the solid state drive device 1 in the data storage system 1000 may verify whether the solid state drive device 1 has been normally or properly installed by observing the light-emitting element 250 via the through hole 130 from the outside of the rack 800.

The rack 800 may include the plurality of sliding units 810 extending in the first direction X on the inner side wall thereof. The sliding unit 810 may include the first sliding unit 812 and the second sliding unit 814, which are spaced apart from each other by a protruding structure unit 820 of the inner side wall of the rack 800 and extend in parallel with each other.

The rail unit 120 of the solid state drive device 1 may be coupled with (e.g. configured to interface or mate with) the sliding unit 810 corresponding thereto. For example, the first rail 122 and the second rail 124 of the rail unit 120 may be directly coupled so as to slidably engage with a first sliding unit 812 and a second sliding unit 814 of the sliding unit 810, respectively.

The solid state drive device 1 may be installed in the data storage system 1000 without a separate carrier device through a direct coupling of the rail unit 120 and the sliding unit 810.

The solid state drive device 1 may be installed in the accommodating space 850 such that the rack front edge unit 800F which defines the accommodating space 850 inside the rack 800 and the first edge EG1 are aligned in the vertical direction Z.

In other words, the data storage system 1000 may not need an additional space for a carrier device around the first edge EG1, the second edge EG2, and the fourth edge EG4 of the solid state drive device 1. Accordingly, the data storage system 1000 may reduce an accommodating space of the rack 800 to accommodate the plurality of solid state drive devices 1. Thus, a data storage system including the solid state drive device 1 according to embodiments of the inventive concepts may reduce a volume thereof for an identical storage capacity, and may increase storage capacity thereof for an identical space. Although described herein primarily with reference to rail units and grooves that are on or integrated in a top cover of the housing, it will be understood that the rail units and/or grooves may be similarly on or integrated in the bottom cover of the housing in accordance with embodiments described herein.

While the inventive concepts have been particularly shown and described with reference to example embodiments thereof, the example embodiments should not be construed as being limited to the descriptions set forth herein, and it will be understood by one of ordinary skill in the art that various changes in form and details may be made therein without departing from the spirit and scope of the inventive concepts as defined by the following claims.

What is claimed is:

1. A solid state drive device comprising:
   a housing comprising an interior space and first, second, third, and fourth edges defining a perimeter thereof;
   a package substrate module in the interior space, the package substrate module comprising a package base substrate, a plurality of semiconductor chips mounted on the package base substrate, and an external connector adjacent to the third edge of the housing opposite the first edge; and
   a first insulating structure and a second insulating structure between the package substrate module and the housing,
   wherein the first insulating structure and the second insulating structure each comprise an L-shape,
   wherein the housing comprises at least one groove adjacent to the first edge and a rail unit that is integral to each of the second and fourth edges,
   wherein the rail unit comprises a first protruding rail and a second protruding rail, which are configured to directly slidably engage with a first sliding unit and a second sliding unit, respectively, of a plurality of sliding units integrated in sidewalls of a rack of a data storage system in which the solid state drive device is accommodated, wherein the first protruding rail and the second protruding rail are separated from each other and extend in parallel with each other in a direction from the first edge to the third edge of the housing.

2. The solid state drive device of claim 1, further comprising an insulating layer on a surface of the at least one groove of the housing.

3. The solid state drive device of claim 1, wherein the housing comprises a connector groove on the third edge which exposes the external connector.

4. The solid state drive device of claim 3, wherein the package substrate module further comprises a light-emitting element which is mounted on the package base substrate and is aligned with a through hole in the first edge.

5. The solid state drive device of claim 1, wherein the at least one groove comprises a first groove between the first edge and the fourth edge of the housing, and a second groove between the first edge and the second edge of the housing.

6. The solid state drive device of claim 1, wherein the at least one groove comprises a first groove between a top surface of the housing and the first edge, and a second groove between a bottom surface of the housing and the first edge.

7. The solid state drive device of claim 1, wherein the at least one groove is in at least one of the second edge or the fourth edge that are adjacent to the first edge of the housing.

8. The solid state drive device of claim 7, wherein a portion of the housing adjacent to the first edge defines a hook shape with respect to the at least one groove.

9. The solid state drive device of claim 1, wherein a horizontal width of a portion of the housing adjacent to the first edge is less than that of a portion of the housing adjacent to the third edge.

10. A solid state drive device comprising:
    a housing comprising an interior space and first, second, third, and fourth edges defining a perimeter thereof, the housing comprising at least one groove on an exterior surface thereof adjacent to the first edge, and a rail unit that is integral to and protrudes from each of the second and fourth edges;
    a package substrate module in the interior space, the package substrate module comprising a package base substrate, a plurality of semiconductor chips on the package base substrate, and an external connector adjacent to the third edge of the housing opposite the first edge; and
    an insulating layer on a surface of the at least one groove of the housing,
    a first insulating structure and a second insulating structure on an interior surface of the housing adjacent to the insulating layer,
    wherein the first insulating structure and the second insulating structure each comprise an L-shape, and
    wherein the insulating layer comprises a material having lower heat conductivity than a material of the housing, and wherein a surface roughness of the insulating layer is greater than that of the housing.

11. The solid state drive device of claim 10, wherein the first insulating structure and the second insulating structure are between the package substrate module and the housing.

12. The solid state drive device of claim 10, wherein the rail unit comprises a first protruding rail and a second protruding rail, which are separated from each other and extend in parallel with each other from the first edge to the third edge, on each of the second edge and the fourth edge, and—wherein the housing is configured to directly engage with a rack of a data storage system free of an interface with a separate carrier device therebetween.

13. A data storage system comprising:
a rack comprising a plurality of sliding units extending in a first direction and integrated in opposing inner sidewalls of the rack, the rack defining an inner accommodating space;
a data management unit comprising a plurality of sockets thereon; and
a plurality of solid state drive devices configured to be installed in the rack free of interfaces with a separate carrier device therebetween, the solid state drive devices respectively comprising:
a housing comprising an interior space and first, second, third, and fourth edges defining a perimeter thereof; a top cover that is adjacent the first, second, third, and fourth edges and encloses the interior space; a plurality of semiconductor chips in the interior space and mounted on a package base substrate; and an external connector coupled with a respective socket of the plurality of sockets; and
a first insulating structure and a second insulating structure between the package base substrate and the housing,
wherein the first insulating structure and the second insulating structure each comprise an L-shape,
wherein the housing comprises at least one groove adjacent to the first edge, a connector groove adjacent to the external connector on the third edge opposite the first edge, and a rail unit, which is configured to directly mate with a respective sliding unit of the plurality of sliding units, that is integral to and protrudes from each of the second edge and the fourth edge and extending in the first direction,
wherein each of the plurality of sliding units comprises a first sliding unit and a second sliding unit comprising respective recesses which are separated from each other and extend in parallel with each other, and wherein the rail unit comprises a first protruding rail and a second protruding rail which are configured to be directly coupled to the respective recesses of the first sliding unit and the second sliding unit, respectively, wherein the first protruding rail and the second protruding rail are separated from each other with a recessed surface therebetween and extend in parallel with each other, and
wherein the first protruding rail is directly adjacent the top cover of the housing.

14. The data storage system of claim 13, wherein the package base substrate further comprises a light-emitting element on the package base substrate, and the housing comprises a through hole in the first edge that is aligned with the light-emitting element.

15. The data storage system of claim 14, wherein the light-emitting element is configured to emit light in a direction away from the package base substrate, through the through hole, and external to the housing.

16. The data storage system of claim 13, further comprising an insulating layer which is on a surface of the at least one groove of the housing, wherein the insulating layer comprises a material having lower heat conductivity than the housing, and has greater surface roughness than the housing.

17. The data storage system of claim 13, wherein a rack front edge unit further defining the interior space and the first edge of the housing are aligned with each other in a direction in which the plurality of solid state drive devices are configured to be installed.

* * * * *